(12) United States Patent
Hille et al.

(10) Patent No.: US 10,535,743 B2
(45) Date of Patent: *Jan. 14, 2020

(54) METALLIZATION AND ITS USE IN, IN PARTICULAR, AN IGBT OR A DIODE

(71) Applicant: Infineon Technologies AG, Neubiberg (DE)

(72) Inventors: Frank Hille, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 103 days.

This patent is subject to a terminal disclaimer.

(21) Appl. No.: 15/708,299

(22) Filed: Sep. 19, 2017

(65) Prior Publication Data

US 2018/0047815 A1 Feb. 15, 2018

Related U.S. Application Data

(60) Continuation of application No. 13/655,239, filed on Oct. 18, 2012, now abandoned, which is a
(Continued)

(30) Foreign Application Priority Data

Mar. 16, 2004 (DE) .................. 10 2004 012 818

(51) Int. Cl.
*H01L 29/732* (2006.01)
*H01L 29/32* (2006.01)
(Continued)

(52) U.S. Cl.
CPC ............ *H01L 29/32* (2013.01); *H01L 21/263* (2013.01); *H01L 21/266* (2013.01);
(Continued)

(58) Field of Classification Search
CPC ............ H01L 29/417; H01L 29/41741; H01L 29/7395; H01L 29/7827; H01L 27/2454;
(Continued)

(56) References Cited

U.S. PATENT DOCUMENTS 4,049,944 A 9/1977 Garvin et al.
4,295,148 A 10/1981 Marine et al.
(Continued)

FOREIGN PATENT DOCUMENTS

DE 4010370 A1 10/1990
DE 10025567 A1 12/2001
(Continued)

*Primary Examiner* — Monica D Harrison
*Assistant Examiner* — John Lin
(74) *Attorney, Agent, or Firm* — Murphy, Bilak & Homiller, PLLC

(57) ABSTRACT

A vertical power semiconductor component includes a semiconductor chip, the semiconductor chip having a top main surface and a bottom main surface. Each of said top main surface and said bottom main surface is in a heat exchanging relationship with a top metallization layer and a bottom metallization each of which serving as a heat sink. Each of said top metallization layer and said bottom metallization layer have a layer thickness of at least 15 μm and have a specific heat capacity per volume that is at least a factor of 1.3 higher than the specific heat capacity per volume of the semiconductor chip. Each of said top metallization layer and said bottom metallization layer serving as a heat sink contacts the respective main surface via a respective diffusion barrier layer.

22 Claims, 2 Drawing Sheets

Related U.S. Application Data continuation of application No. 13/206,257, filed on Aug. 9, 2011, now Pat. No. 8,314,019, which is a division of application No. 11/082,192, filed on Mar. 16, 2005, now Pat. No. 8,008,712.

(51) Int. Cl.
  *H01L 21/263* (2006.01)
  *H01L 21/266* (2006.01)
  *H01L 29/417* (2006.01)
  *H01L 29/739* (2006.01)

(52) U.S. Cl.
  CPC ...... *H01L 29/417* (2013.01); *H01L 29/41741* (2013.01); *H01L 29/7395* (2013.01)

(58) Field of Classification Search
  CPC ..... H01L 21/823487; H01L 21/823885; H01L 21/4871; H01L 23/34; H01L 23/36; H01L 23/367; H01L 21/76841; H01L 23/53223; H01L 23/53238; H01L 23/53252; H01L 23/53266; H01L 2221/1073
  See application file for complete search history.

(56) References Cited

U.S. PATENT DOCUMENTS

| | | |
|---|---|---|
| 5,138,439 A | 8/1992 | Kobiki |
| 5,156,994 A | 10/1992 | Moslehi |
| 5,285,352 A | 2/1994 | Pastore et al. |
| 5,457,072 A | 10/1995 | Tamaki et al. |
| 5,639,989 A | 6/1997 | Higgins, III et al. |
| 5,786,634 A | 7/1998 | Nishikawa et al. |
| 5,864,169 A | 1/1999 | Shimura et al. |
| 5,942,797 A | 8/1999 | Terasawa et al. |
| 6,191,477 B1 | 2/2001 | Hashemi |
| 6,225,694 B1 | 5/2001 | Terui |
| 6,232,650 B1 | 5/2001 | Ichitani et al. |
| 6,504,242 B1 | 1/2003 | Deppisch et al. |
| 6,559,023 B2 | 5/2003 | Otsuki et al. |
| 6,636,381 B1 | 10/2003 | Yazawa et al. |
| 6,690,087 B2 | 2/2004 | Kobayashi et al. |
| 6,740,580 B1 | 5/2004 | Gupta et al. |
| 6,759,301 B2 | 7/2004 | Takei et al. |
| 7,276,764 B1 | 10/2007 | Sakamoto |
| 2001/0023091 A1* | 9/2001 | Yamaguchi ......... H01L 21/3003 438/151 |
| 2002/0080587 A1 | 6/2002 | Vinciarelli et al. |
| 2002/0127783 A1 | 9/2002 | Otsuki et al. |
| 2002/0149102 A1 | 10/2002 | Hashemi et al. |
| 2003/0020174 A1 | 1/2003 | Kohno |
| 2003/0222290 A1 | 12/2003 | Rodov et al. |
| 2004/0063302 A1* | 4/2004 | Takahashi ............. H01L 21/263 438/542 |

FOREIGN PATENT DOCUMENTS

| | | |
|---|---|---|
| DE | 10205323 A1 | 8/2002 |
| EP | 1077494 A1 | 2/2001 |
| WO | 9313549 A1 | 7/1993 |

* cited by examiner

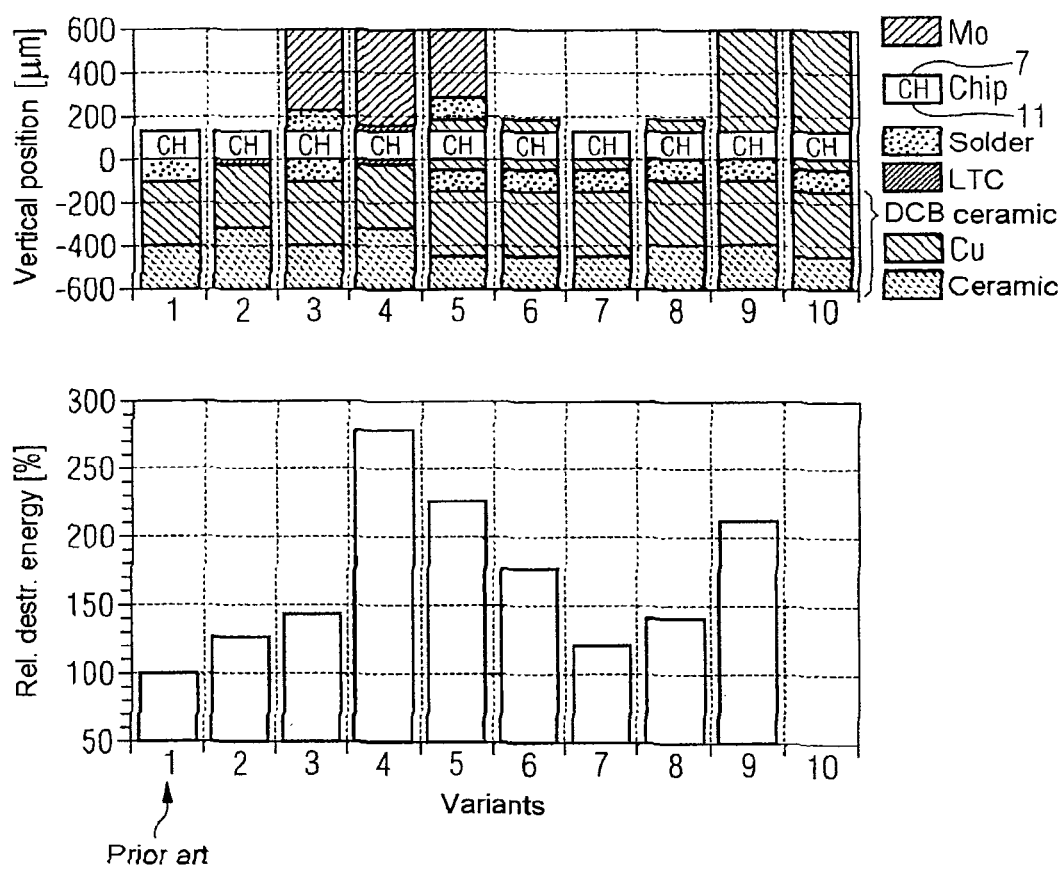

10,535,743 B2

METALLIZATION AND ITS USE IN, IN PARTICULAR, AN IGBT OR A DIODE

This application is a continuation application of U.S. patent application Ser. No. 13/655,239, filed Oct. 18, 2012, which is a continuation of Ser. No. 13/206,257, filed Aug. 9, 2011, which is a divisional application of U.S. patent application Ser. No. 11/082,192, filed Mar. 16, 2005, which in turn claims priority to German Patent Application No. 10 2004 012 818.9, filed Mar. 16, 2004.

FIELD OF THE INVENTION

The present invention relates to a method for fabricating a power semiconductor component that has a metallization.

BACKGROUND

As is known, the short circuit strength of an IGBT (insulated gate bipolar transistor) is thermally limited with regard to its destruction after a turn-off. This can be attributed to the fact that a very high energy is liberated during a short circuit situation in the IGBT, which energy has to be dissipated rapidly by cooling if destruction of the IGBT is to be prevented.

At the present time, IGBTs are soldered on one side by means of solder by their chip rear side onto a so-called DCB ceramic (DCB=direct copper bonding). This involves a ceramic plate which is coated with copper on both sides and is used in modular technology as a mechanical carrier of the chips and for making electrical contact with the chips. It is the case, however, that solder has a relatively weak thermal conductivity. On account of this unfavorable thermal property, it thus represents a "brake" for the cooling of the IGBT.

On account of the low thermal conductivity of solder, the solder connecting technique is therefore occasionally replaced by the thermally better suited low-temperature connecting technique (LTC). The latter enables an increased dissipation of heat from a semiconductor chip.

Finally, it is also possible to cool a semiconductor chip from its front side in addition to its rear side. For this purpose, a further thermal capacity, which is made available by a relatively thick molybdenum lamina, for example, is applied to the front side of the chip.

To summarize, the following proposals have thus been made heretofore for improving the dissipation of heat from a semiconductor chip of an IGBT:

(a) replacing the customary solder on the rear side of the chip by LTC, (b) soldering a lamina composed of molybdenum, in particular, onto the front side of the chip, and (c) replacing the solder at the rear side of the chip by LTC as in proposal (a) and connecting a lamina composed of molybdenum, in particular, onto the front side of the chip by means of LTC.

However, at the present time, LTC is still not suitable for a modular production of IGBTs. Although soldering a lamina composed of molybdenum onto the front side of the chip boosts the dissipation of heat from the semiconductor chip, its effectiveness is limited owing to the poor thermal properties of the solder that is once again used in this case. There is not yet any practical experience for connecting a lamina composed of molybdenum by means of LTC.

For these reasons, none of the above proposals (a) to (c) has gained acceptance in practice heretofore.

The problem of rapidly dissipating heat from a semiconductor chip occurs not only in the case of IGBTs but also, in principle, in the case of diodes in surge current operation. The semiconductor chip is destroyed in this case, too, if the energy generated in surge current operation cannot be dissipated fast enough from the semiconductor chip. The above considerations for IGBTs therefore hold true in the same way for diodes.

During the fabrication of, in particular, IGBTs and diodes, a proton irradiation may be performed in order that deep dopant profiles or profiles with charge carriers having a reduced lifetime are incorporated into a semiconductor chip in a targeted manner. The fabrication of a field stop zone at a depth of 10 µm, for example, from the rear side of the chip by means of a proton irradiation shall be mentioned as an example. If, in this example, the proton irradiation is carried out from the rear side of the chip, then a strongly localized excessive increase in doping arises in the so-called "end-of-range region" of the proton implantation. This excessive increase in doping is then situated approximately at a distance of 10 µm from the rear side of the chip. FIG. 2 of the accompanying drawings show such a profile of the doping concentration as a function of the depth from the rear side of the chip using a solid line, working with an energy of 750 keV in silicon and with an effective proton dose of 1e12 cm$^{-2}$ in this case.

The strongly localized excessive increase in doping is unfavorable for the switching behavior of IGBTs and diodes, however, since an electric field that penetrates into the field stop zone, that is to say into the region with the strongly localized excessive increase in doping, is abruptly braked, which leads to a great increase in the voltage rise dU/dt. This great increase in dU/dt poses considerable difficulties in applications of IGBTs and diodes.

For the switching behavior of IGBTs and diodes, it would therefore be significantly more favorable if the profile of the field stop zone, the so-called field stop profile, trailed off gently into the semiconductor chip. With a conventional proton implantation from the rear side of the chip, however, this is possible only when a plurality of implantations with different energies and thus different penetration depths are performed in a staggered manner. However, this constitutes a considerable outlay.

As an alternative, thought has already been given to carrying out a proton implantation from the front side of the chip. The "end-of-range region" would be greatly widened in this case. However, it is then necessary to radiate through the entire drift zone of the semiconductor component. As a result of this radiating-through process, however, on the one hand, the doping in the drift zone is determined by the so-called "tail region" of the proton irradiation precisely in the case of semiconductor substrates having a very high resistance. On the other hand, the position of the proton peaks relative to the rear side of the chip becomes dependent on fluctuations in the thickness of the semiconductor substrate. Moreover, properties of oxide layers on the front side of the semiconductor chip may also be altered by the irradiation.

Overall, then, proton irradiation both from the rear side of the chip and from the front side of the chip poses considerable problems that have not been solved heretofore.

For targeted relief of the loading of the edge of diodes or IBGTs during dynamic switching, the HDR concept (HDR=high dynamic robustness) employed at the present time seeks to reduce the plasma flooding in the edge region of diodes, in particular. This reduction of the plasma flooding in the edge region relieves the loading of the latter during dynamic switching operations. This relief of loading is actually realized by means of a masked cathode implantation into the rear side of the chip below the active chip region, but not below the edge region. In other words, an injection of charge carriers below the edge region scarcely takes place as a result of this. What is disadvantageous about such a procedure, however, is the need for a phototechnology on the rear side of the chip as well in order thus to be able to perform the masked cathode implantation below the active region but not below the edge.

If an irradiation technique is used for reducing the lifetime of the charge carriers in the edge region of a diode, then it is necessary, if a plurality of chips are present on a semiconductor wafer, also to apply a plurality of thick metal masks, the accurate alignment of which is very complicated.

SUMMARY

Proceeding from the above considerations, the invention is based on the object of specifying a metallization for power semiconductor components, in particular IGBTs and diodes, which—as far as IGBTs are concerned—improves the short circuit strength thereof with regard to destruction after a turn-off and which—as far as diodes are concerned—increases the surge current strength thereof; moreover, the intention is to readily enable a targeted widening of field stop profiles during fabrication by means of a proton irradiation; finally, the intention is also to ensure targeted relief of the loading of the edge region during dynamic switching and to specify a method for fabricating such a metallization.

This object is achieved according to the invention by means of a metallization for power semiconductor components as described herein. The object is further achieved by a method of fabricating a power semiconductor component having a semiconductor body having at least two main surfaces. The method includes applying a layer of a metallization on at least one of the main surfaces, the layer having a thickness of at least 15 μm, the layer serving as a heat sink. The method also includes producing a field stop zone in the semiconductor body by implantation of protons or helium through the layer.

The layer thickness of the at least one layer is at least 15 μm. It is preferably at least 20 μm.

At least some embodiments of the invention are particularly advantageously applied to IGBTs and to diodes. In this case, the metallization according to the invention can be used to produce a field stop layer by proton irradiation from the rear side of the chip or wafer or for masking a proton or helium implantation from the front side of a semiconductor chip. In this respect, reference is made to patent claims 10 to 15. Patent claim 16 specifies an advantageous method for fabricating the metallization.

In the case of the embodiments described herein, then, a material whose specific heat capacity is at least a factor of 1.3 higher than the specific heat capacity of the semiconductor chip is used for the at least one layer, that is to say for the emitter contact and/or the collector contact in the case of an IGBT, for example. The specific heat capacity of the material of said layer is preferably a factor of 2 greater than the specific heat capacity of the semiconductor chip. In any event, however, the specific thermal conductivity of the material of said layer should be greater than the specific thermal conductivity of the semiconductor chip. If the semiconductor chip is composed of silicon, by way of example, then the latter has a specific heat capacity of 1.63 J/(° K cm\Copper, which has a specific heat capacity of 3.43 J/(° K cm$^3$) is then preferably suitable as material for the at least one layer. Other materials that are likewise suitable are aluminum, silver and gold.

The absolute thermal capacity of the at least one layer is preferably equal to at least 10% of the thermal capacity of the semiconductor chip.

In the case of some embodiments of the invention, depositing a layer having a high thermal conductivity and specific heat capacity reduces the so-called thermal impedance "Zth" (Zth is a time-dependent impedance) of the semiconductor chip for short timescales. This results in an increased short circuit robustness of an IGBT and an enhanced surge current strength of a diode, which are otherwise both thermally limited per se. The implantation profile of the field stop zone is widened during implantation of protons through the layer on the rear side of the chip, by way of example. This in turn brings about a more favorable switching behavior of IGBTs and diodes.

If the layer is deposited selectively onto metallizations that are already present on the front side of the chip, by way of example, then it can be utilized as masking for subsequent proton or helium implantations. In other words, a relief of the loading of the diode edge in a manner similar to the HDR concept can be achieved thereby. The layer can be electrodeposited or deposited by vapor deposition onto the rear side and/or front. side of the semiconductor chip.

A significant advantage of at least some embodiments of the invention thus resides in the simultaneous reduction of Zth and the widening or masking of proton or helium implantations by means of a single measure, namely the application of the at least one layer to the at least one main surface.

BRIEF DESCRIPTION OF THE DRAWINGS

The invention is explained in more detail below with reference to the drawings, in which:

FIG. 3 shows a bar chart with results from electrothermal component simulations for short circuit destruction of an IGBT for 1200 V after turn-off of a current pulse, showing various mounting variants (cf. upper half) and relative destruction energies (cf. lower half), in relation to the prior art (cf. variant 1).

DETAILED DESCRIPTION

Figure 1:
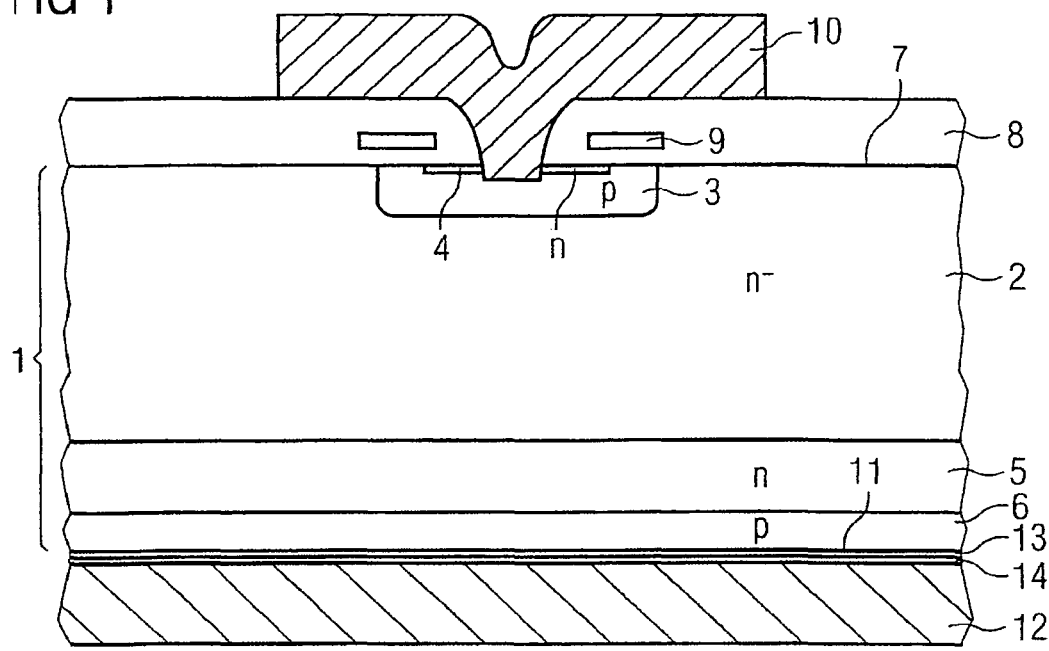
FIG. 1 shows a schematic sectional illustration through an IGBT according to the teaching of the invention.

FIG. 1 shows a section through an IGBT having a semiconductor body or chip 1 made preferably of silicon or another suitable semiconductor material (e.g. SiC or AmBv), In this semiconductor body 1, a p-conducting base zone 3 is introduced into an n--conducting base zone 2, an n- or n+-conducting source or emitter zone 4 being situated in said base zone 3. Furthermore, the semiconductor body 1 has an n- or n+-conducting field stop zone 5 and also a p-conducting collector zone 6. It goes without saying that the conduction types specified may also be respectively reversed.

If only the zones 3 (p-conducting), 2 (n--conducting) and, if appropriate, 5 (n-conducting) are provided, then a diode is present. The emitter zone 4 and the collector zone 6 are therefore omitted in this case. The following considerations for an IGBT hold true in the same way for a diode having a construction of this type or a similar construction.

An insulating layer 8 made, for example, of silicon dioxide and/or silicon nitride is situated on a first main surface 7 of the semiconductor body 1. A gate electrode 9 made, in particular, of polycrystalline silicon is introduced into said insulating layer 8. A diode, of course, does not have such a gate electrode.

In the first main surface 7, the emitter zone 4 and the p-type base zone 3 are contact-connected via a first contact (emitter contact) 10.

A second main surface 11 of the semiconductor body 1 opposite to the first main surface 7 is provided with a second contact (collector contact) 12.

A diffusion barrier layer 13 made, for example, of Ti, TiN, Ta, TaN or combinations thereof may also be provided between the collector zone 6, that is to say the second main surface 11 of the semiconductor body 1, and the second contact 12. The combinations Ti/TiN and Ta/TaN are particularly preferred. Said diffusion barrier layer 13 protects the silicon of the semiconductor body 1 against indiffusion of atoms from the contact 12.

The diffusion barrier layer 13 may, if appropriate, also be provided with an aluminum layer 14, which further limits said indiffusion. The layer 14 may—as illustrated—be situated between the layers 12 and 13, or else between the main surface 11 and the layer 13.

If appropriate, the layers 13, 14 may also be fitted for the first contact 10. Moreover, the first contact 10 may be applied to a metallization already present, which is generally very thin and thus exhibits good thermal conduction.

In the case of an IGBT and also in the case of a diode, rapid dissipation of heat from the semiconductor body 1 or the semiconductor chip is crucially accelerated according to the invention by virtue of the fact that sufficiently thick layers, namely the contacts 10, 12, which have a high specific heat capacity and a good thermal conductivity are applied as far as possible directly to the semiconductor chip. In order that these layers or contacts 10, 12 are highly effective thermally, their specific heat capacity must be at least a factor of 1.3, preferably a factor of 2, greater than the specific heat capacity of the semiconductor body 1 and their (absolute) thermal capacity should have a magnitude at least equal to half the thermal capacity of the semiconductor chip comprising the semiconductor body 1. The specific thermal conductivity of the contacts should be greater than the specific thermal conductivity of the semiconductor body 1.

A suitable material for these conditions for specific heat capacity and specific thermal conductivity is preferably copper, aluminum, silver or gold.

If appropriate, these metals may also be "mixed" or used in alloys. In other words, in the case of the present invention, the layers of the contacts 10, 12 are applied to the semiconductor body 1 or to the insulating layer 8 as far as possible directly and if need be via the diffusion barrier layer 13 and the aluminum layer 14 or a metallization that is already present.

The layer thickness of the contacts 10, 12 is at least 15 µm and preferably at least 20 µm.

It goes without saying that it is also possible to provide, instead of two copper layers for the contacts 10, 12, only one copper layer, for example the copper layer for the contact 12, and thus to construct the contact in a customary manner. In this case, the thermal capacity of said layer 12 should have a magnitude at least equal to the thermal capacity of the semiconductor chip with the semiconductor body 1.

The layers for the contacts 10, 12 may be applied by electrodeposition or by vapor deposition onto the front side of the chip, that is to say the main surface 7, or in particular the rear side of the chip, that is to say the main surface 11. An additional heat sink preferably made of molybdenum can then be soldered onto the layer for the contact 10 at the front side by means of solder, by way of example. This is done after a proton irradiation that may be provided has been performed through the layer for the contact 12 (cf. variant 5 in FIG. 3 explained further below).

As an alternative, the copper layer for the contact 12 is deposited up to a thickness of 50 µm, for example. The proton irradiation is then effected through this layer. A further reinforcement of the copper layer is then possible by means of a further galvanic process (cf. variant 10 in FIG. 3). That is to say that the deposition of the copper layer is stopped in a targeted manner at a thickness such as is necessary for widening the proton profile, and after the irradiation.

In the case of an IGBT constructed according to the invention or a diode provided according to the invention and, if appropriate, also in the case of a transistor having the metallization according to the invention, the high thermal conductivity of the layers for the corresponding contacts 10 and 12 has the effect that the thermal energy dissipated during a turn-off or a surge current loading of the component, from the semiconductor chip 1, can be rapidly transferred into the thermal capacities of said layers. For subsequent heat sinks in accordance with variants 5 to 7 and 10, it is then possible to employ the thermally non-optimum connecting technique by means of solder.

The layers for the contacts 10, 12 have a layer thickness such that the above condition for the thermal capacity (thermal capacity of the layers or the layer is greater than half the thermal capacity of the semiconductor chip) is fulfilled. It has been shown that preferred layer thicknesses lie between 20 and 60 µm, preferably between 40 and 60 µm, and, in particular, a layer thickness of 50 µm is chosen. These dimensions hold true in particular for copper as material for the contacts 10, 12 and a thickness of the semiconductor body 1 composed of silicon of approximately 120 µm.

It should be noted that, instead of copper, aluminum, silver or gold, it is also possible, if appropriate, to choose a different material having similar properties to these materials. The invention is therefore not restricted to the use of these materials.

The copper of the contacts 10, 12 may, if appropriate, also be provided with a customary covering layer, for example by means of deposition, in order thus to avoid corrosion of the copper. Suitable materials for such a covering layer are NiP—Pd—Au, for example.

If a proton implantation is effected from the rear side of the chip (or else the front side of the chip), that is to say via the main surface 11 (or respectively 7) of the semiconductor body 1 for the purpose of forming the field stop zone 5, then the implantation profile is greatly widened—as has been shown—by virtue of the copper layer of the contact 12. A heat treatment in the range of approximately 350° C. to 450° C. subsequent to the implantation then leads to the doping effect of the proton implantation, thus giving rise to the layer 5 effecting the field stop. Such a field stop layer 5 is preferably used for IGBTs and diodes.

Figure 2:
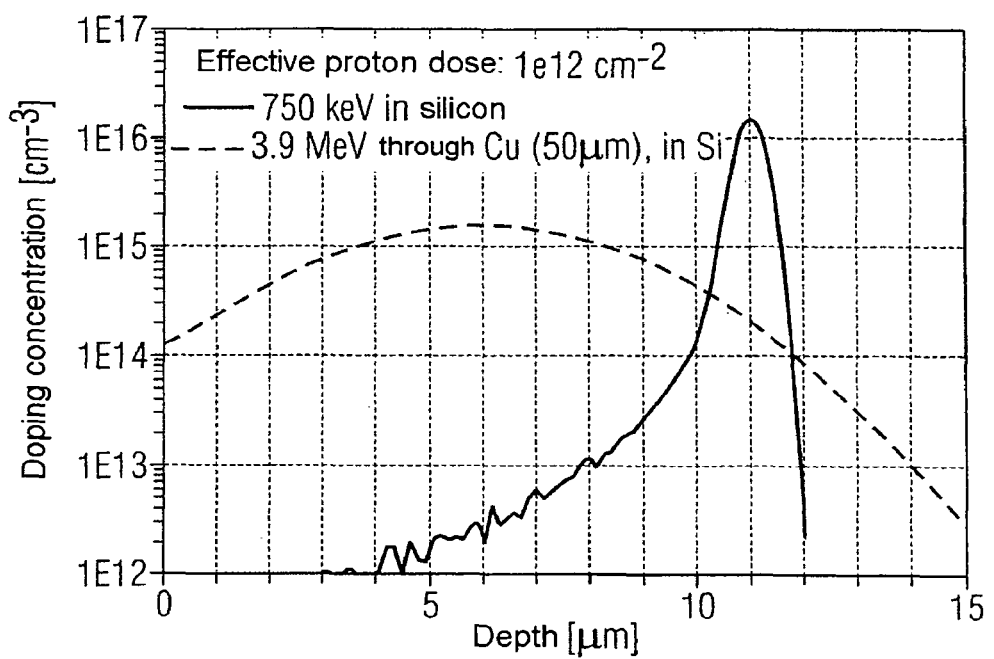
FIG. 2 shows a diagram revealing the widening of a field stop profile during a proton implantation through a copper layer having a thickness of approximately 50 μm.

FIG. 2 uses a dashed line to show this widening effect for an effective proton dose of 1e12 $cm^{-2}$ at an implantation energy of 3.9 MeV through a 50 µm thick copper layer in a silicon body. If the profile of this curve is compared with the profile of the curve for an implantation at 750 keV without a copper layer in a silicon body, then the considerable widening of the implantation profile is immediately apparent. Strongly localized excessive increases in doping are thus avoided, thereby considerably improving the switching behavior of IGBTs and diodes in the case of an implantation for the field stop layer through a copper layer having a thickness of approximately 50 µm. With the gentle doping profile, the electric field is not braked abruptly, with the result that great increases in the voltage rise dU/dt do not occur in this case.

The implantation of protons through the copper layer having a thickness of 20 to 60 µm and preferably approximately 50 µm thus effects a field stop profile that runs up gently in the semiconductor chip, which could otherwise only be achieved by means of a plurality of stacked implantations with different energies in conventional proton implantation technology.

The use of the copper layers for the contacts thus affords a considerable advantage besides the good dissipation of heat for the implantation: multiple implantations can be avoided in a surprisingly simple manner.

In the fabrication of diodes, on the front side of the chip, that is to say on the main surface 7 of the semiconductor 1, the active chip area, that is to say the area in the region of the zone 3, is covered by the copper layer of the contact 10.

If a proton or helium implantation is then carried out from the front side of the chip, then said copper layer of the contact 10 acts as masking which stops a proton implantation which, without masking, would penetrate up to 100 µm into the silicon of the semiconductor 1.

If such an implantation and a subsequent heat treatment for a number of hours are performed at temperatures lying between 220° C. and 350° C., then a charge carrier lifetime reduction is achieved in the edge region of the semiconductor chip, that is to say in the region outside the contact 10. As a consequence, the plasma concentration is thus reduced below the edge of the diode as a result of recombination, which means a dynamic relief of the loading of the edge.

In other words without additional phototechnology as in the case of HDR (cf. above), the material, in particular copper, of the layer forming the contact 10 achieves a masking of the implantation and thus a reduced plasma flooding in the edge. Said additional phototechnology is not necessary since the material for the layer forming the contact 10 can be applied to the front side of the semiconductor body in a self-aligned manner by means of selective deposition.

FIG. 3 which has already been discussed a number of times above, illustrates the advantages of the invention specifically with regard to the relative destruction energy (cf. the lower half of FIG. 3).

In detail, variant 1 shows the present-day prior art: A chip CH is applied over a solder layer and a copper layer on ceramic. Variants 2 and 4 presuppose the novel connecting technique LTC, which has already been mentioned in the introduction. In variant 2, the copper layer of the substrate ceramic is connected to the semiconductor chip CH via an LTC layer. In variant 4, the semiconductor chip CH has an LTC layer on both sides, which is connected to a molybdenum lamina on the front side of the chip and to the DCB ceramic on the rear side of the chip.

Variant 3 shows a case in which—as explained in the introduction—the rear side of the chip is contact-connected in accordance with variant 1, while the front side of the chip is connected to a molybdenum lamina via a solder layer.

Variants 5 to 10 in each case use the metallization according to the invention. In variant 5, a copper layer having a thickness of approximately 50 µm is applied to the semiconductor chip CH on both sides, which copper layer is provided with a molybdenum lamina via a solder layer on the front side of the chip and with a further copper layer likewise via a solder layer on the rear side of the chip.

Variant 6 differs from variant 5 in that the solder layer and the molybdenum lamina are omitted on the front side of the chip. In variant 7, the copper layer is also absent on the front side of the chip. Variant 8 corresponds to variant 6 with regard to the front side of the chip. On the rear side of the chip in the case of variant 8, however, the copper layer is connected to the semiconductor chip CH via a solder layer in a conventional manner. Variants 9 and 10 have a very thick copper layer having a layer thickness of more than 200 µm on the front side of the chip. The rear side of the chip is configured in a conventional manner in variant 9 with a DCB ceramic connected by a solder layer, while in variant 10 it has a copper layer which is applied directly to the rear side of the chip and is again provided with the DCB ceramic via a solder layer.

Variant 6 constitutes a particularly preferred variant according to the invention: This is because it is possible in this case to retain the conventional connecting technique that only a pure optimization is performed at the chip level. The copper layers having a thickness of approximately 50 µm that are provided on both sides in this variant act as short-term heat sinks and are distinctly superior to soldering on a molybdenum lamina, for instance according to variant 3.

If variant 6 is compared with the prior art in accordance with variant 1, then an increase in the relative destruction energy from 100% (prior art) to approximately 175% (invention) is apparent. That is to say that the semiconductor component provided with the metallization according to the invention is not destroyed until at a dissipated energy amplified by a factor of 1.75. In other words, components configured in accordance with the present invention can be loaded to a significantly greater extent during operation.

Additional heat sinks, for instance in accordance with variant 5, may provide for a further significant improvement by soldering on the molybdenum lamina. A subsequent reinforcement of the copper, as in variant 10, is likewise possible. The efficacy for variant 10, which has not yet been definitively determined, should lie between variants 4 and 5, that is to say in the region of approximately 250%.

To summarize, at least some embodiments of the invention provide a metallization which carries away dissipated thermal energy in an outstanding manner from a component in the event of a turn-off or surge loading thereof. This metallization may additionally be utilized, on the rear side of the chip, for the proton implantation for widening the field stop profile and, on the front side of the chip, as masking for a proton or helium implantation for the targeted incorporation of recombination centers below the edge region specifically of diodes.

It will be appreciated that the above-described embodiments are merely illustrative, and that those of ordinary skill in the art may readily devise their own implementations and modifications that incorporate the principles of the present invention and fall within the spirit and scope thereof.

What is claimed is:

1. A vertical power semiconductor component comprising a semiconductor body, the semiconductor body having a top main surface and a bottom main surface, wherein each of said top main surface and said bottom main surface is in a heat exchanging relationship with a top metallization layer and a bottom metallization layer each of which serving as a heat sink, each of said top metallization layer and said bottom metallization layer having a layer thickness of at least 15 µm and having a specific heat capacity per volume that is at least a factor of 1.3 higher than the specific heat capacity per volume of the semiconductor body, wherein each of said top metallization layer and said bottom metallization layer serving as a heat sink are in a heat exchanging relationship the respective main surface via a respective diffusion barrierlayer.

2. The vertical power semiconductor component according to claim 1, wherein at least one layer of the top metallization layer and the bottom metallization layer serving as a heat sink is electrically coupled to the semiconductor body.

3. The vertical power semiconductor component of claim 2, wherein at least one layer of the top metallization layer and the bottom metallization layer serving as a heat sink forms an electrical contact for the power semiconductor component.

4. The vertical power semiconductor component according to claim 1, wherein the diffusion barrier layer is formed from at least one of the group consisting of Ti, TiN, Ta, TaN and Al.

5. The vertical power semiconductor component according to claim 4, wherein the diffusion barrier layer is formed by a first sublayer composed of Ti/TiN or Ta/TaN, and a second sublayer composed of Al.

6. The vertical power semiconductor component according to claim 1, wherein at least one layer of the top metallization layer and the bottom metallization layer serving as a heat sink is formed from at least one of the group consisting of copper, aluminum, silver and gold.

7. The vertical power semiconductor component according to claim 1, wherein at least one layer of the top metallization layer and the bottom metallization layer serving as a heat sink has a layer thickness of 20 to 60 µm.

8. The vertical power semiconductor component according to claim 1, wherein at least one layer of the top metallization layer and the bottom metallization layer serving as a heat sink is created by electrodeposition the layer or by vapor deposition.

9. The vertical power semiconductor component according to claim 1, wherein the top metallization layer is a patterned metallization layer covering only part of the top main surface.

10. The vertical power semiconductor component according to claim 1, wherein the top metallization layer adjoins another metallization layer.

11. The vertical power semiconductor component according to claim 1, further comprising a metallization layer between the diffusion barrier layer and the top main surface.

12. The vertical power semiconductor component according to claim 1, wherein at least one of said top metallization layer and said bottom metallization layer has a specific heat capacity per volume that is at least a factor of 2 higher than the specific heat capacity per volume of the semiconductor body.

13. The vertical power semiconductor component according to claim 1, further comprising an aluminum layer between the bottom main surface and the bottom metallization layer.

14. The vertical power semiconductor component according to claim 1, wherein the top metallization layer is a copper metallization layer and the bottom metallization layer is a silver metallization layer.

15. The vertical power semiconductor component according to claim 1, wherein the top metallization layer is a silver metallization layer and the bottom metallization layer is a silver metallization layer.

16. A vertical power semiconductor component comprising a semiconductor body, the semiconductor body having a top main surface and a bottom main surface, wherein each of said top main surface and said bottom main surface is in a heat exchanging relationship with a top metallization layer and a bottom metallization layer each of which serving as a heat sink, each of said top metallization layer and said bottom metallization layer having a layer thickness of at least 15 µm and has a thermal capacity that is at least 10% of the thermal capacity of the semiconductor body, wherein each of said top metallization layer and said bottom metallization layer serving as a heat sink are in a heat exchanging relationship the respective main surface via a respective diffusion barrier layer.

17. The vertical power semiconductor component according to claim 16, wherein both layers of the top metallization layer and the bottom metallization layer serving as heat sinks have a layer thickness of 15 to 30 µm.

18. The vertical power semiconductor component according to claim 16, wherein at least one layer of the top metallization layer and the bottom metallization layer serving as a heat sink has a thermal capacity having a magnitude equal to or larger than half the thermal capacity of the semiconductor body.

19. The vertical power semiconductor component according to claim 16, wherein at least one layer of the top metallization layer and the bottom metallization layer serving as a heat sink is electrically coupled to the semiconductor body.

20. The vertical power semiconductor component according to claim 16, wherein at least one layer serving as a heat sink of the top metallization layer and the bottom metallization layer is formed from at least one of the group consisting of copper, aluminum, silver and gold.

21. The vertical power semiconductor component according to claim 16, wherein at least one layer serving as a heat sink of the top metallization layer and the bottom metallization layer has a layer thickness of 20 to 60 µm.

22. The vertical power semiconductor component according to claim 16, wherein at least one layer serving as a heat sink of the top metallization layer and the bottom metallization layer is formed by electrodepositon the layer or by vapor deposition.

* * * * *